US011062653B2

(12) United States Patent
Chen et al.

(10) Patent No.: US 11,062,653 B2
(45) Date of Patent: Jul. 13, 2021

(54) DISPLAY APPARATUS AND OPERATION METHOD FOR DISPLAY PANEL THEREOF

(71) Applicant: Novatek Microelectronics Corp., Hsinchu (TW)

(72) Inventors: Tse-Yuan Chen, Miaoli County (TW); Jung-Hsuan Sung, Hsinchu (TW); Chien-Yu Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/167,537

(22) Filed: Oct. 23, 2018

(65) Prior Publication Data

US 2020/0126483 A1 Apr. 23, 2020

(51) Int. Cl.
*G09G 3/3258* (2016.01)
*H01L 51/52* (2006.01)

(52) U.S. Cl.
CPC ....... *G09G 3/3258* (2013.01); *H01L 51/5206* (2013.01); *H01L 51/5221* (2013.01); *G09G 2310/0264* (2013.01)

(58) Field of Classification Search
CPC ............... G09G 3/3233; G09G 3/3291; G09G 2300/0819; G09G 2300/0852; G09G 2300/0866
See application file for complete search history.

(56) References Cited

U.S. PATENT DOCUMENTS 6,858,992 B2 2/2005 Park et al.
7,965,263 B2 6/2011 Parikh et al.
8,803,770 B2 8/2014 Jeong et al.
8,937,580 B2 1/2015 Miyagawa
2004/0041525 A1* 3/2004 Park ..................... G09G 3/3233 315/169.3
2005/0030265 A1 2/2005 Miyagawa
(Continued)

FOREIGN PATENT DOCUMENTS

CN 1479270 3/2004
CN 1553265 12/2004
(Continued)

OTHER PUBLICATIONS

Yahiro et al., "Recoverable degradation phenomena of quantum efficiency in organic EL devices," Synthetic Metals, Jun. 2000, pp. 245-247.
(Continued)

*Primary Examiner* — Shaheda A Abdin
(74) *Attorney, Agent, or Firm* — JCIPRNET

(57) ABSTRACT

A display apparatus and an operation method for a display panel thereof are provided. The display apparatus includes a display panel and a voltage supply circuit. The display panel includes a pixel circuit and a common voltage line. The pixel circuit includes an organic light emitting diode (OLED), wherein a cathode of the OLED is coupled to the common voltage line. The voltage supply circuit is coupled to the common voltage line of the display panel. The voltage supply circuit supplies a common voltage to the common voltage line during a normal operation period. The voltage supply circuit supplies a reverse bias voltage higher than the common voltage to the common voltage line during a recovery period to reversely bias the OLED.

14 Claims, 8 Drawing Sheets

(56) References Cited

U.S. PATENT DOCUMENTS

| | | | | |
|---|---|---|---|---|
| 2008/0094320 | A1* | 4/2008 | Parikh | G09G 3/3233 345/76 |
| 2012/0001893 | A1 | 1/2012 | Jeong et al. | |
| 2015/0123109 | A1 | 5/2015 | Miyagawa | |
| 2015/0131367 | A1* | 5/2015 | Kato | G11C 14/0054 365/154 |
| 2015/0248859 | A1 | 9/2015 | Miyagawa | |
| 2016/0125808 | A1 | 5/2016 | Hsu et al. | |
| 2017/0124954 | A1* | 5/2017 | Park | H01L 27/3244 |

FOREIGN PATENT DOCUMENTS

| | | |
|---|---|---|
| CN | 101271669 | 9/2008 |
| CN | 102314829 | 1/2012 |
| CN | 104464635 | 3/2015 |
| KR | 101282399 | 7/2013 |

OTHER PUBLICATIONS

“Office Action of China Counterpart Application”, dated Oct. 26, 2020, pp. 1-10.

* cited by examiner

DISPLAY APPARATUS AND OPERATION METHOD FOR DISPLAY PANEL THEREOF

BACKGROUND

Field of the Invention

The invention relates to a display apparatus and more particularly, to an operating method for a display panel.

Description of Related Art

Many display apparatuses are equipped with light emitting diode (LED) display panels, for example, organic light emitting diode (OLED) display panels. After the OLED has been used for a period of time, a phenomenon of decay may occur, which may result in display abnormality.

SUMMARY

The invention provides a display apparatus and an operation method for a display panel thereof to suppress or improving the phenomenon of decay of an organic light emitting diode (OLED) of a pixel circuit.

According to an embodiment of the invention, a display apparatus is provided. The display apparatus includes a display panel and a voltage supply circuit. The display panel includes a pixel circuit and a common voltage line. The pixel circuit includes an OLED, wherein a cathode of the OLED is coupled to the common voltage line. The voltage supply circuit is coupled to the common voltage line of the display panel. The voltage supply circuit supplies a common voltage to the common voltage line during a normal operation period. The voltage supply circuit supplies a reverse bias voltage higher than the common voltage to the common voltage line during a recovery period to reversely bias the OLED.

An embodiment of the invention provides an operation method for a display panel is provided. The display panel includes a pixel circuit and a common voltage line. The pixel circuit includes an OLED, wherein a cathode of the OLED is coupled to the common voltage line. The operation method includes: supplying a common voltage to the common voltage line during a normal operation period; and supplying a reverse bias voltage higher than the common voltage to the common voltage line during a recovery period to reversely bias the OLED.

To sum up, by the display apparatus and the operation method for the display panel thereof provided by the embodiments of the invention, the reverse bias voltage can be applied to the OLED of the pixel circuit during the recovery period. After the OLED has been reversely biased for a period of time, photoelectric characteristics of the OLED can be considerably recovered. The display apparatus and the operation method for the display panel thereof can achieve suppressing or improving the phenomenon of decay of the OLED of the pixel circuit.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
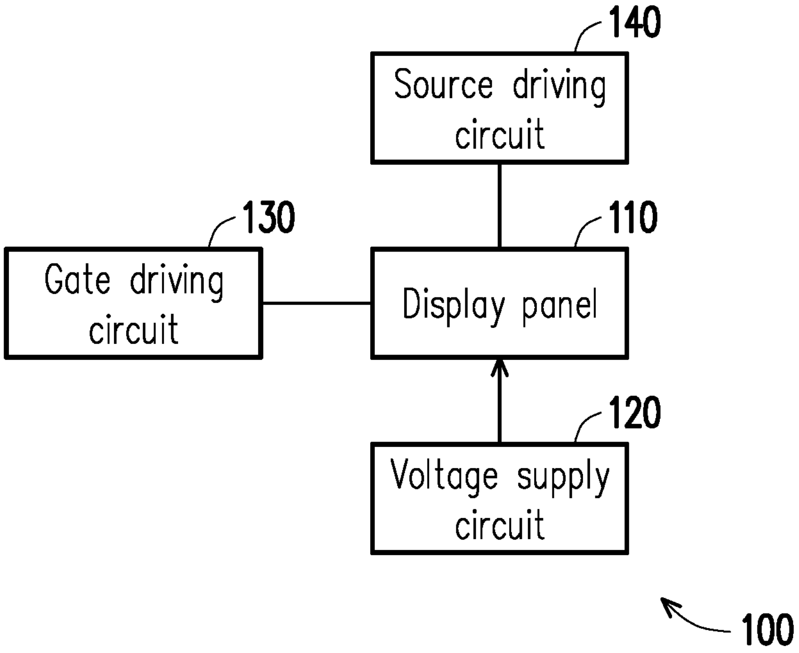
FIG. 1 is a schematic circuit block diagram illustrating a display apparatus according to an embodiment of the invention.

The term "couple (or connect)" herein (including the claims) are used broadly and encompass direct and indirect connection or coupling means. For example, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. Moreover, elements/components/steps with same reference numerals represent same or similar parts in the drawings and embodiments. Elements/components/notations with the same reference numerals in different embodiments may be referenced to the related description.

FIG. 1 is a schematic circuit block diagram illustrating a display apparatus 100 according to an embodiment of the invention. The display apparatus 100 illustrated in FIG. 1 includes a display panel 110, a voltage supply circuit 120, a gate driving circuit 130 and a source driving circuit 140. The display panel 110 includes a plurality of pixel circuits (which are not shown in FIG. 1). The gate driving circuit 130 is connected to a control line (which is not shown in FIG. 1, for example, a scan line) of the display panel 110, so as to scan the pixel circuits. The source driving circuit 140 is connected to the control line (which is not shown in FIG. 1) of the display panel 110, so as to input a data voltage into the pixel circuits. An implementation manner of the pixel circuits may be determined based on a design requirement. For example, the pixel circuits of the display panel 110 may refer to the description related to a pixel circuit 200 illustrated in FIG. 2, a pixel circuit 300 illustrated in FIG. 3, a pixel circuit 800 illustrated in FIG. 8 or a pixel circuit 1200 illustrated in FIG. 12.

Each of the pixel circuits of the display panel 110 includes an organic light emitting diode (OLED, which is not shown in FIG. 1). Cathodes of the OLEDs are coupled to a common electrode (or a common voltage line which is not shown in FIG. 1) of the display panel 110. The voltage supply circuit 120 is coupled to the common voltage line of the display panel 110. The voltage supply circuit 120 supplies a common voltage to the common voltage line of the display panel 110 during a normal operation period. The operation details of the display panel 110 during the normal operation period are not limited in the present embodiment. For example, the operation of the display panel 110 during the normal operation period may be a conventional driving operation or other driving operations.

The voltage supply circuit 120 supplies a reverse bias voltage higher than the common voltage to the common voltage line of the display panel 110 during a recovery period to reversely bias the OLED. A level of the common voltage and a level of the reverse bias voltage may be determined based on design requirement. For example, in some embodiments, the reverse bias voltage may be a power supply voltage of the display panel 110, and the common voltage may be a ground voltage of the display panel 110. The implementation manner of the voltage supply circuit 120 is not limited in the present embodiment. For example, in some embodiments, the voltage supply circuit 120 may include a conventional voltage regulator or any other power conversion circuit/element. Different voltage regulators may provide voltages at different levels. By a switching mechanism, the voltage supply circuit 120 may selectively supply different voltage levels (for example, the common voltage or the reverse bias voltage) to the common voltage line of the display panel 110.

An operation method for the display panel 110 includes the following steps. In a normal driving step, the voltage supply circuit 120 may supply the common voltage (i.e., a low voltage) to the common voltage line of the display panel 110 during the normal operation period. In other words, the cathodes of the OLEDs may receive the common voltage (i.e., the low voltage) through the common electrode of the display panel 110 during the normal operation period. In a recovery step, the voltage supply circuit 120 may supply the reverse bias voltage (i.e., a high voltage) to the common voltage line of the display panel 110 during the recovery period. The cathodes of the OLEDs may receive the reverse bias voltage (i.e., the high voltage) through the common electrode of the display panel 110 during the recovery period, thereby reversely biasing the OLEDs.

Based on a design requirement, the recovery period may be arranged in any time zone during the operational process of the display apparatus. For example, in some embodiments, the recovery period may be arranged in a vertical blanking period between two frames. In some other embodiments, the recovery period may be arranged in a power-on initializing period or a power-off processing period of the display apparatus 100. The display apparatus 100 may apply the reverse bias voltage to the OLEDs of the pixel circuits during the recovery period. After the OLEDs have been reversely biased for a period of time, photoelectric characteristics of the OLEDs may be considerably recovered. Thus, the display apparatus 100 and the operation method for the display panel thereof may suppress (or improve) the phenomenon of decay of the OLEDs of the pixel circuits.

Figure 2:
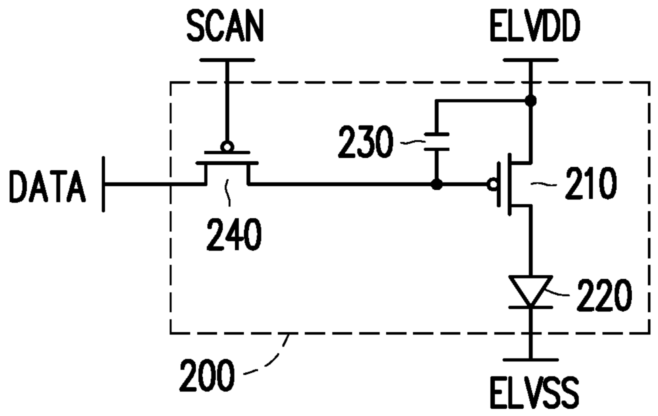
FIG. 2 is a schematic circuit block diagram illustrating a pixel circuit according to an embodiment of the invention.

FIG. 2 is a schematic circuit block diagram illustrating a pixel circuit 200 according to an embodiment of the invention. The pixel circuit 200 illustrated in FIG. 2 includes a transistor 210, an OLED 220, a storage capacitor 230 and a switch 240. A first terminal (e.g., a source) of the transistor 210 is coupled to a power supply voltage line ELVDD of the display panel 110. A second terminal (e.g., a drain) of the transistor 210 is coupled to an anode of the OLED 220. A cathode of the OLED 220 is coupled to a common voltage line ELVSS of the display panel 110. During a normal operation period, the voltage supply circuit 120 may supply a power supply voltage of the display panel 110 to the power supply voltage line ELVDD and supply a common voltage (e.g., a ground voltage or any other reference voltage) of the display panel 110 to the common voltage line ELVSS. The power supply voltage is higher than the common voltage. The power supply voltage line ELVDD may transmit the power supply voltage to the pixel circuit 200, and the common voltage line ELVSS may transmit the common voltage to the pixel circuit 200.

A first terminal of the storage capacitor 230 is coupled to the power supply voltage line ELVDD of the display panel 110. A second terminal of the storage capacitor 230 is coupled to a control terminal (e.g., a gate) of the transistor 210. A first terminal of the switch 240 is coupled to a data line DATA of the display panel 110. A second terminal of the switch 240 is coupled to a control terminal of the transistor 210. A control terminal of the switch 240 is coupled to a scan line SCAN of the display panel 110. The gate driving circuit 130 may control the switch 240 through the scan line SCAN. During the normal operation period, when the switch 240 is turned on, the source driving circuit 140 may store a data voltage in the storage capacitor 230 through the data line DATA. The data voltage may determine a current flowing through the transistor 210, so as to determine a luminance of the OLED 220.

During a recovery period, the voltage supply circuit 120 supplies a reverse bias voltage (which is higher than the common voltage) to the common voltage line ELVSS of the display panel 110 and supplies a low voltage (e.g., a negative voltage or any other voltage lower than the reverse bias voltage) to the power supply voltage line ELVDD, so as to reversely bias the OLED 220. The gate driving circuit 130 may turn on the switch 240 during the recovery period, and the source driving circuit 140 may supply the data voltage to the control terminal of the transistor 210 to turn on the transistor 210 during the recovery period. When the transistor 210 is turned on, the OLED 220 may be reversely biased by the low voltage of the power supply voltage line ELVDD and the reverse bias voltage (i.e., the high voltage) of the common voltage line ELVSS. After the OLED 220 has been reversely biased for a period of time, photoelectric characteristics of the OLED 220 may be considerably recovered.

Figure 3:
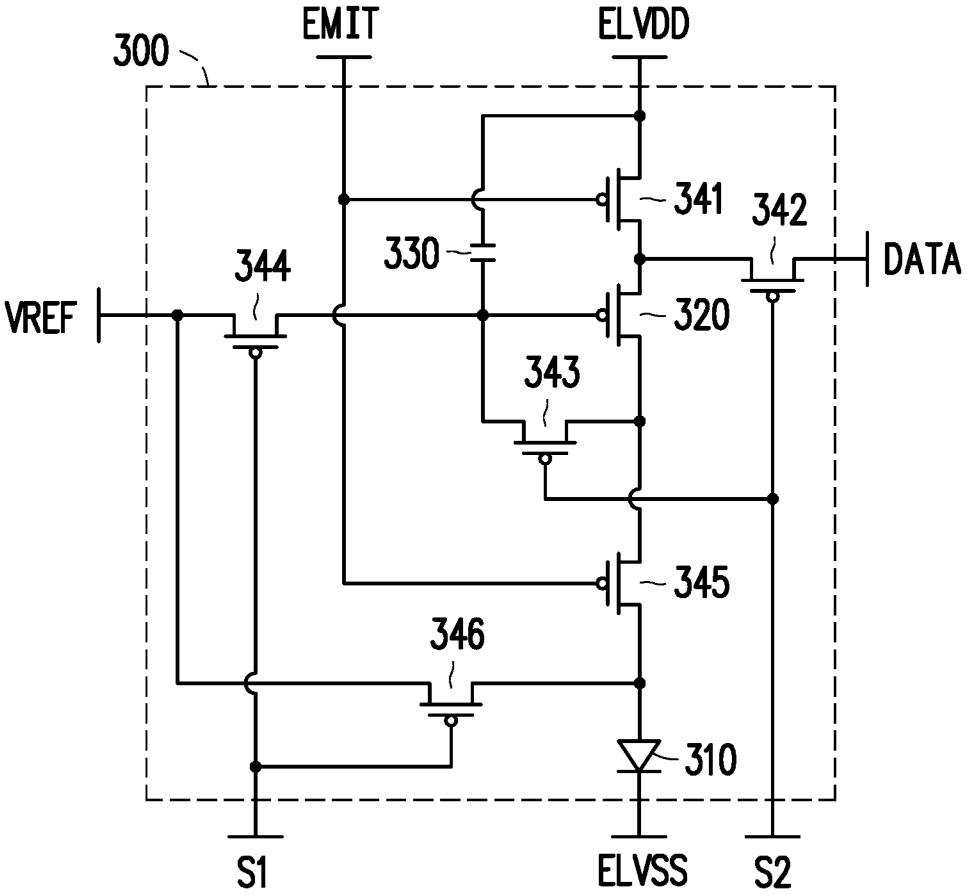
FIG. 3 is a schematic circuit block diagram illustrating a pixel circuit according to another embodiment of the invention.

FIG. 3 is a schematic circuit block diagram illustrating a pixel circuit 300 according to another embodiment of the invention. The pixel circuit 300 illustrated in FIG. 3 includes an OLED 310, a transistor 320, a storage capacitor 330, a first switch 341, a second switch 342, a third switch 343, a fourth switch 344, a fifth switch 345 and a sixth switch 346. A first terminal of the first switch 341 is coupled to the power supply voltage line ELVDD. A control terminal of the first switch 341 is coupled to the emission control line EMIT. A first terminal (e.g., a source) of the transistor 320 is coupled to a second terminal of the first switch 341. A first terminal of the storage capacitor 330 is coupled to the power supply voltage line ELVDD. A second terminal of the storage capacitor 330 is coupled to a control terminal (e.g., a gate) of the transistor 320. A first terminal of the second switch 342 is coupled the data line DATA. A control terminal of the second switch 342 is coupled to a second scan line S2. A second terminal of the second switch 342 is coupled to the first terminal of the transistor 320.

A first terminal of the third switch 343 is coupled to the control terminal of the transistor 320. A second terminal of the third switch 343 is coupled to a second terminal (e.g., a drain) of the transistor 320. A control terminal of the third switch 343 is coupled to the second scan line S2. A first terminal of the fourth switch 344 is coupled to an initializing voltage line VREF. A second terminal of the fourth switch 344 is coupled to the control terminal of the transistor 320. A control terminal of the fourth switch 344 is coupled to a first scan line S1. A control terminal of the fifth switch 345 is coupled to the emission control line EMIT. A first terminal of the fifth switch 345 is coupled to the second terminal of the transistor 320. A second terminal of the fifth switch 345 is coupled to an anode of the OLED 310. A cathode of the OLED 310 is coupled to the common voltage line ELVSS. A first terminal of the sixth switch 346 is coupled to the initializing voltage line VREF. A second terminal of the sixth switch 346 is coupled to the anode of the OLED 310. A control terminal of the sixth switch 346 is coupled to the first scan line S1.

During a normal operation period, the voltage supply circuit 120 may supply a power supply voltage of the display panel 110 to the power supply voltage line ELVDD, supply an initializing voltage to the initializing voltage line VREF and supply a common voltage (e.g., a ground voltage or any other reference voltage) of the display panel 110 to the common voltage line ELVSS. The power supply voltage is higher than the common voltage, and the initializing voltage is also higher than the common voltage. A voltage difference between the initializing voltage and the common voltage is less than a threshold voltage of the OLED 310, and thus, the OLED 310 is not lit when the sixth switch 346 is turned on.

Figure 4:
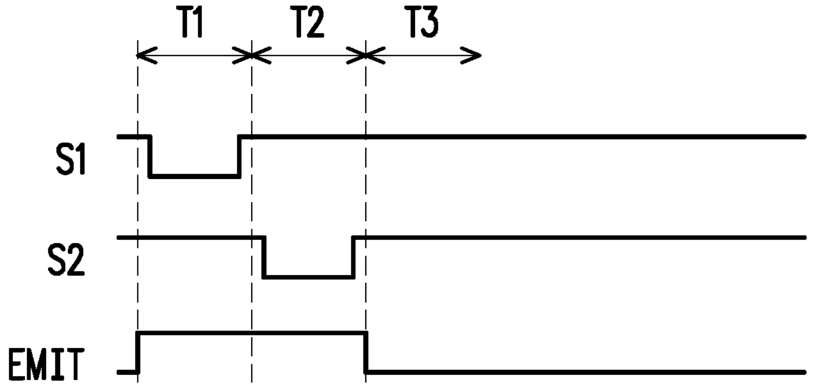
FIG. 4 is a schematic timing diagram of a control signal of the pixel circuit depicted in FIG. 3 during the normal operation period according to an embodiment of the invention.

FIG. 4 is a schematic timing diagram of a control signal of the pixel circuit 300 depicted in FIG. 3 during the normal operation period according to an embodiment of the invention. During the normal operation period, the driving operation of the pixel circuit 300 may be divided into an initial period T1, a compensation period T2 and an emission period T3. Referring to FIG. 1, FIG. 3 and FIG. 4, the source driver circuit 140 is coupled to the data line DATA of the display panel 110. The gate driver circuit 130 is coupled to the first scan line S1, the second scan line S2 and the emission control line EMIT of the display panel 110.

During the initial period T1, a voltage of the first scan line S1 is at a low level, and voltages of the second scan line S2 and the emission control line EMIT are at high levels. Thus, the fourth switch 344 and the sixth switch 346 are turned on, and the first switch 341, the second switch 342, the third switch 343 and the fifth switch 345 are turned off. In this circumstance, the initializing voltage line VREF may precharge the OLED 310 by the initializing voltage and reset a voltage of the storage capacitor 330.

During the compensation period T2, the voltage of the second scan line S2 is at a low level, and the voltages of the first scan line S2 and the emission control line EMIT are at high levels. Thus, the second switch 342 and the third switch 343 are turned on, and the first switch 341, the fourth switch 344, the fifth switch 345 and the sixth switch 346 are turned off. In this circumstance, the data voltage of the data line DATA may be stored in the storage capacitor 330 through the second switch 342, the transistor 320 and the third switch 343.

During the emission period T3, the voltage of the emission control line EMIT is at a low level, and the voltages of the first scan line S1 and the second scan line S2 are at high levels. Thus, the first switch 341 and the fifth switch 345 are turned on, and the second switch 342, the third switch 343, the fourth switch 344 and the sixth switch 346 are turned off. In this circumstance, the data voltage of the storage capacitor 330 may determine a current of the transistor 320, so as to determine a luminance of the OLED 310.

Referring to FIG. 3, during the recovery period, the voltage supply circuit 120 supplies a reverse bias voltage (which is higher than the common voltage) to the common voltage line ELVSS of the display panel 110 and supplies a low voltage (e.g., a negative voltage or any other voltage lower than the reverse bias voltage) to the initializing voltage line VREF, so as to reversely bias the OLED 310. The gate driving circuit may turn on the sixth switch 346 during the recovery period. The voltage of the data line DATA may be in a floating state during the recovery period. When the sixth switch 346 is turned on, the OLED 310 may be reversely biased by the low voltage of the initializing voltage line VREF and the reverse bias voltage (i.e., the high voltage) of the common voltage line ELVSS. After the OLED 310 has been reversely biased for a period of time, photoelectric characteristics of the OLED 310 may be considerably recovered.

Figure 5:
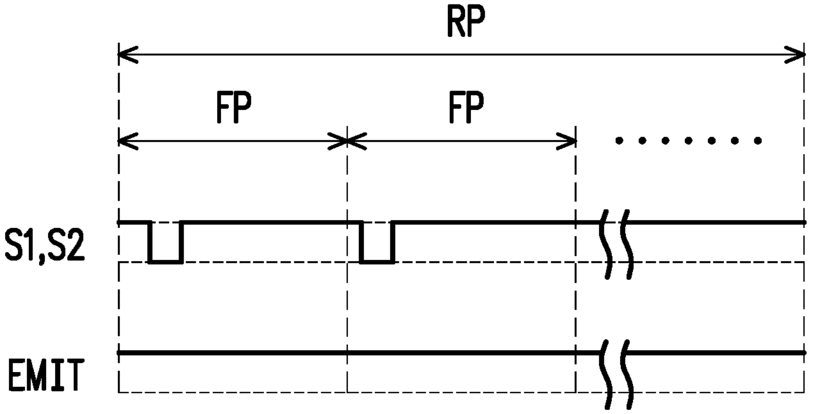
FIG. 5 is a schematic timing diagram of the control signal of the pixel circuit depicted in FIG. 3 during a recovery period according to an embodiment of the invention.

FIG. 5 is a schematic timing diagram of the control signal of the pixel circuit 300 depicted in FIG. 3 during a recovery period RP according to an embodiment of the invention. Referring to FIG. 3 and FIG. 5, during the recovery period RP, the voltage of the emission control line EMIT is maintained at a high level, i.e., the first switch 341 and the fifth switch 345 are kept turned-off. In the example illustrated in FIG. 5, a length of the recovery period RP includes a plurality of frame periods FP. In each of the frame periods FP illustrated in FIG. 5, the voltage of each of the first scan line S1 and the second scan line S2 has a negative pulse. When the voltage of each of the first scan line S1 and the second scan line S2 is a low voltage, the second switch 342, the third switch 343, the fourth switch 344 and the sixth switch 346 are turned on. When the sixth switch 346 is turned on, the OLED 310 may be reversely biased by the low voltage of the initializing voltage line VREF and the reverse bias voltage (i.e., the high voltage) of the common voltage line ELVSS. After the OLED 310 has been reversely biased for a period of time, the photoelectric characteristics of the OLED 310 may be considerably recovered.

Figure 6:
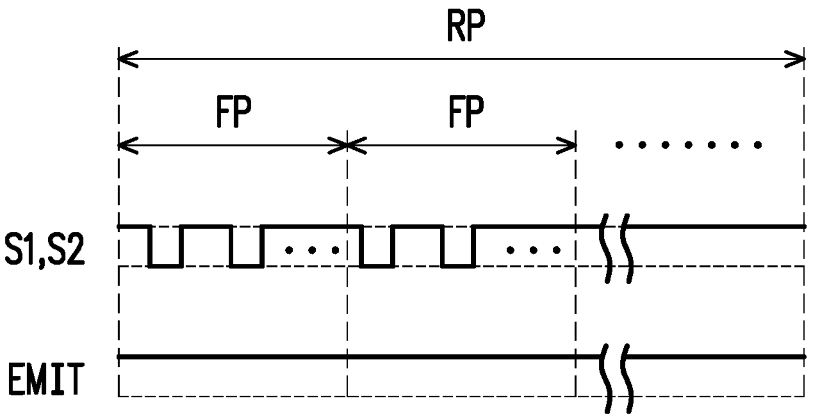
FIG. 6 is a schematic timing diagram of the control signal of the pixel circuit depicted in FIG. 3 during the recovery period according to another embodiment of the invention.

FIG. 6 is a schematic timing diagram of the control signal of the pixel circuit 300 depicted in FIG. 3 during the recovery period RP according to another embodiment of the invention. Referring to FIG. 3 and FIG. 6, during the recovery period RP, the voltage of the emission control line EMIT is maintained at a high level, i.e., the first switch 341 and the fifth switch 345 are kept turned-off. In the example illustrated in FIG. 6, a length of the recovery period RP includes a plurality of frame periods FP. In each of the frame periods FP illustrated in FIG. 6, the voltage of each of the first scan line S1 and the second scan line S2 has a negative pulse. When the voltage of each of the first scan line S1 and the second scan line S2 is a low voltage, the second switch 342, the third switch 343, the fourth switch 344 and the sixth switch 346 are turned on. When the sixth switch 346 is turned on, the OLED 310 may be reversely biased by the low voltage of the initializing voltage line VREF and the reverse bias voltage (i.e., the high voltage) of the common voltage line ELVSS. After the OLED 310 has been reversely biased for a period of time, the photoelectric characteristics of the OLED 310 may be considerably recovered.

Figure 7:
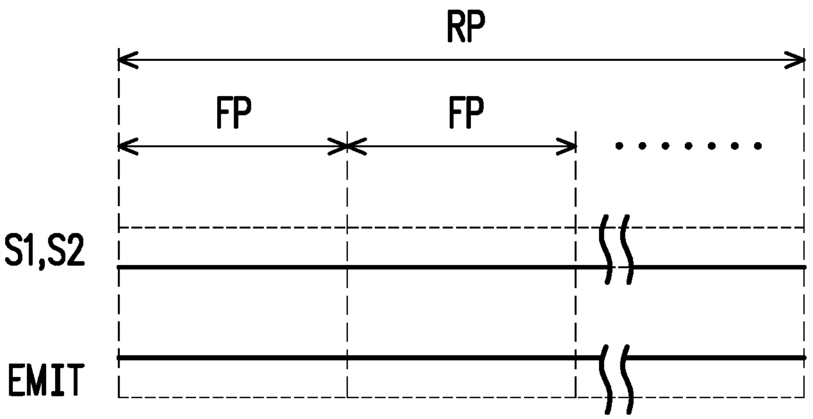
FIG. 7 is a schematic timing diagram of the control signal of the pixel circuit depicted in FIG. 3 during the recovery period according to yet another embodiment of the invention.

FIG. 7 is a schematic timing diagram of the control signal of the pixel circuit 300 depicted in FIG. 3 during the recovery period RP according to yet another embodiment of the invention. Referring to FIG. 3 and FIG. 7, during the recovery period RP, the voltage of the emission control line EMIT is maintained at a high level, the voltage of each of the first scan line S1 and the second scan line S2 is maintained at a low voltage. Thus, during the recovery period RP, the first switch 341 and the fifth switch 345 are kept turned-off, and the second switch 342, the third switch 343, the fourth switch 344 and the sixth switch 346 are kept turned-on. When the sixth switch 346 is turned on, the OLED 310 may be reversely biased by the low voltage of the initializing voltage line VREF and the reverse bias voltage (i.e., the high voltage) of the common voltage line ELVSS. After the OLED 310 has been reversely biased for a period of time, the photoelectric characteristics of the OLED 310 may be considerably recovered.

Figure 8:
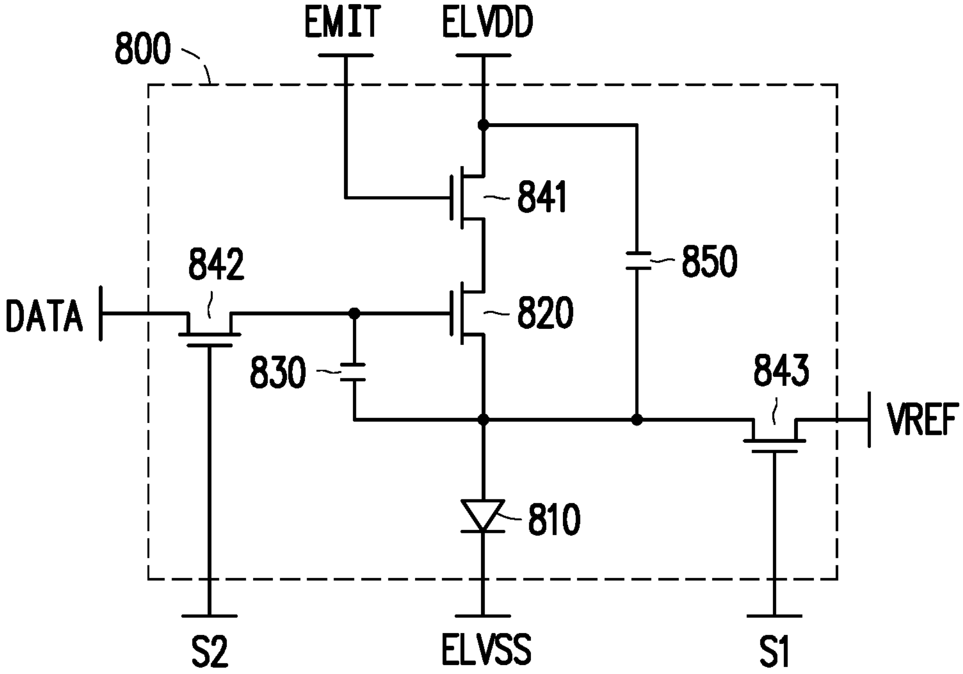
FIG. 8 is a schematic circuit block diagram illustrating a pixel circuit according to yet another embodiment of the invention.

FIG. 8 is a schematic circuit block diagram illustrating a pixel circuit 800 according to yet another embodiment of the invention. The source driver circuit 140 may be coupled to the data line DATA of the display panel 110. The gate driver circuit 130 may be coupled to the first scan line S1, the second scan line S2 and the emission control line EMIT of the display panel 110. The pixel circuit 800 illustrated in FIG. 8 includes an OLED 810, a transistor 820, a storage capacitor 830, a first switch 841, a second switch 842, a third switch 843, and a holding capacitor 850. A first terminal of the first switch 841 is coupled to the power supply voltage line ELVDD. A control terminal of the first switch 841 is coupled to the emission control line EMIT. A first terminal (e.g., a drain) of the transistor 820 is coupled to a second terminal of the first switch 841. A second terminal (e.g., a source) of the transistor 820 is coupled to an anode of the OLED 810. A cathode of the OLED 810 is coupled to the common voltage line ELVSS.

A second terminal of the storage capacitor 830 is coupled to a control terminal (e.g., a gate) of the transistor 820. A second terminal of the storage capacitor 830 is coupled to the second terminal of the transistor 820. A first terminal of the second switch 842 is coupled the data line DATA. A control terminal of the second switch 842 is coupled to a second scan line S2. A second terminal of the second switch 842 is coupled to the control terminal of the transistor 820. A first terminal of the third switch 843 is coupled to the initializing voltage line VREF. A second terminal of the third switch 843 is coupled to the anode of the OLED 810. A control terminal of the third switch 843 is coupled to the first scan line S1. A first terminal of the holding capacitor 850 is coupled to the power supply voltage line ELVDD. A second terminal of the holding capacitor 850 is coupled to the second terminal of the third transistor 843.

During a normal operation period, the voltage supply circuit 120 may supply a power supply voltage of the display panel 110 to the power supply voltage line ELVDD, supply an initializing voltage to the initializing voltage line VREF and supply a common voltage (e.g., a ground voltage or any other reference voltage) of the display panel 110 to the common voltage line ELVSS. The power supply voltage is higher than the common voltage, and the initializing voltage is also higher than the common voltage. A voltage difference between the initializing voltage and the common voltage is less than a threshold voltage of the OLED 810, and thus, the OLED 810 is not lit when the third switch 843 is turned on. The driving operations of the first scan line S1, the second scan line S2 and the emission control line EMIT during the normal operation period may be inferred by analog with reference to the descriptions related to the first scan line S1, the second scan line S2 and the emission control line EMIT illustrated in FIG. 3.

During a recovery period, the voltage supply circuit 120 may supply a reverse bias voltage (which is higher than the common voltage) to the common voltage line ELVSS of the display panel 110 and supply a low voltage (e.g., a negative voltage or any other voltage lower than the reverse bias voltage) to the initializing voltage line VREF, so as to reversely bias the OLED 810. The gate driving circuit 130 may turn on the third switch 843 during the recovery period. The voltage of the data line DATA may be maintained at any fixed voltage during the recovery period. When the third switch 843 is turned on, the OLED 810 may be reversely biased by the low voltage of the initializing voltage line VREF and the reverse bias voltage (i.e., the high voltage) of the common voltage line ELVSS. After the OLED 810 has been reversely biased for a period of time, photoelectric characteristics of the OLED 810 may be considerably recovered.

Figure 9:
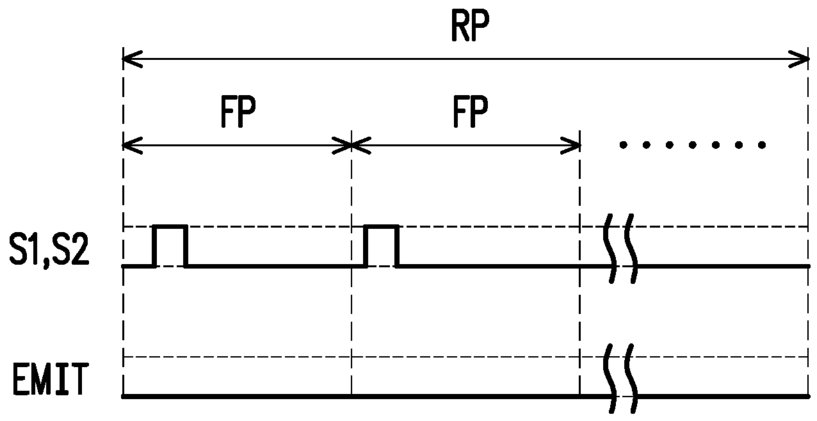
FIG. 9 is a schematic timing diagram of the control signal of the pixel circuit depicted in FIG. 8 during the recovery period according to an embodiment of the invention.

FIG. 9 is a schematic timing diagram of the control signal of the pixel circuit 800 depicted in FIG. 8 during the recovery period RP according to an embodiment of the invention. Referring to FIG. 8 and FIG. 9, during the recovery period RP, the voltage of the emission control line EMIT is maintained at a low level, i.e., the first switch 841 is kept turned-off. In the example illustrated in FIG. 9, a length of the recovery period RP includes a plurality of frame periods FP. In each of the frame periods FP illustrated in FIG. 9, the voltage of each of the first scan line S1 and the second scan line S2 has a positive pulse. When the voltage of each of the first scan line S1 and the second scan line S2 is a high voltage, the second switch 842 and the third switch 843 are turned on. When the third switch 843 is turned on, the OLED 810 may be reversely biased by the low voltage of the initializing voltage line VREF and the reverse bias voltage (i.e., the high voltage) of the common voltage line ELVSS.

Figure 10:
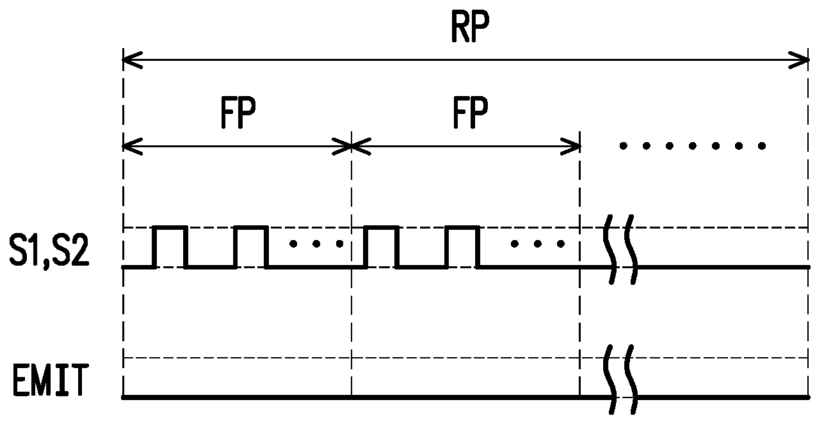
FIG. 10 is a schematic timing diagram of the control signal of the pixel circuit depicted in FIG. 8 during the recovery period according to another embodiment of the invention.

FIG. 10 is a schematic timing diagram of the control signal of the pixel circuit 800 depicted in FIG. 8 during the recovery period RP according to another embodiment of the invention. Referring to FIG. 8 and FIG. 10, during the recovery period RP, the voltage of the emission control line EMIT is maintained at a low level, i.e., the first switch 841 is kept turned-off. In the example illustrated in FIG. 10, a length of the recovery period RP includes a plurality of frame periods FP. In each of the frame periods FP illustrated in FIG. 10, the voltage of each of the first scan line S1 and the second scan line S2 has a plurality of positive pulses. When the voltage of each of the first scan line S1 and the second scan line S2 is a high voltage, the second switch 842 and the third switch 843 are turned on. When the third switch 843 is turned on, the OLED 810 may be reversely biased by the low voltage of the initializing voltage line VREF and the reverse bias voltage (i.e., the high voltage) of the common voltage line ELVSS.

Figure 11:
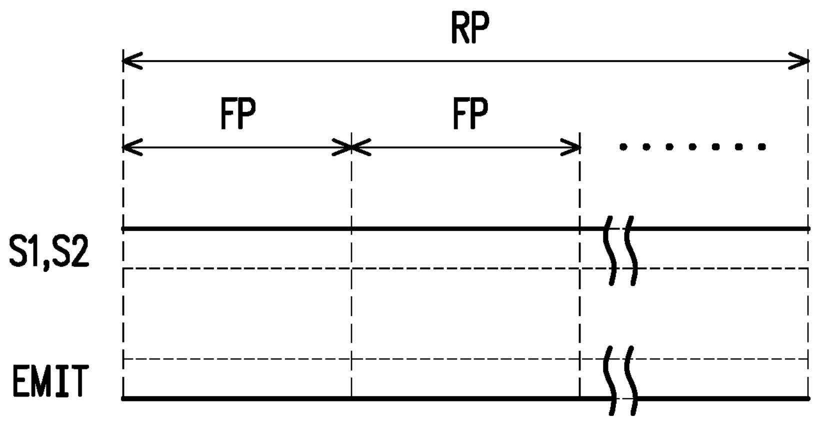
FIG. 11 is a schematic timing diagram of the control signal of the pixel circuit depicted in FIG. 8 during the recovery period according to yet another embodiment of the invention.

FIG. 11 is a schematic timing diagram of the control signal of the pixel circuit 800 depicted in FIG. 8 during the recovery period RP according to yet another embodiment of the invention. Referring to FIG. 8 and FIG. 11, during the recovery period RP, the voltage of the emission control line EMIT is at a low level, and the voltages of the first scan line S1 and the second scan line S2 are at high levels. Thus, during the recovery period RP, the first switch 341 is kept turned-off, and the second switch 842 and the third switch 843 are kept turned-on. When the third switch 843 is turned on, the OLED 810 may be reversely biased by the low voltage of the initializing voltage line VREF and the reverse bias voltage (i.e., the high voltage) of the common voltage line ELVSS.

Figure 12:
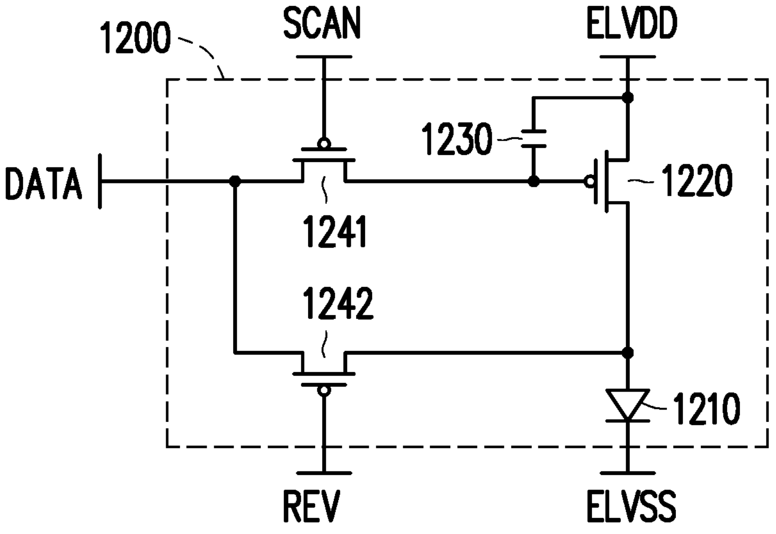
FIG. 12 is a schematic circuit block diagram illustrating a pixel circuit according to still another embodiment of the invention.

FIG. 12 is a schematic circuit block diagram illustrating a pixel circuit 1200 according to still another embodiment of the invention. The source driver circuit 140 may be coupled to the data line DATA of the display panel 110. The gate driver circuit 130 may be coupled to the scan line SCAN and the reverse bias control line REV of the display panel 110. The pixel circuit 1200 illustrated in FIG. 12 includes an OLED 1210, a transistor 1220, a storage capacitor 1230, a first switch 1241 and a second switch 1242. A first terminal (e.g., a source) of the transistor 1220 is coupled to the power supply voltage line ELVDD. A second terminal (e.g., a drain) of the transistor 1220 is coupled to an anode of the OLED 1210. A cathode of the OLED 1210 is coupled to the common voltage line ELVSS. The storage capacitor 1230 is coupled to a control terminal (e.g., a gate) of the transistor 1220. A first terminal of the first switch 1241 is coupled the data line DATA. A second terminal of the first switch 1241 is coupled to the control terminal of the transistor 1220. A control terminal of the first switch 1241 is coupled to the scan line SCAN. A first terminal of the second switch 1242 is coupled the data line DATA. A second terminal of the second switch 1242 is coupled to the anode of the OLED 1210. A control terminal of the second switch 1242 is coupled to the reverse bias control line REV.

During a normal operation period, the voltage supply circuit 120 may supply a power supply voltage of the display panel 110 to the power supply voltage line ELVDD and supply a common voltage (e.g., a ground voltage or any other reference voltage) of the display panel 110 to the common voltage line ELVSS. The power supply voltage is higher than the common voltage. A voltage of the reverse bias control line REV is maintained as a high voltage during the normal operation period, i.e., the second switch 1242 is kept turned-off. The driving operation of the pixel circuit 1200 illustrated in FIG. 12 may be inferred by analog with reference to the description related to the pixel circuit 200 illustrated in FIG. 2 and thus, will not be repeated.

During a recovery period, the voltage supply circuit 120 may supply a reverse bias voltage (which is higher than the common voltage) to the common voltage line ELVSS of the display panel 110. In addition, the reverse bias voltage is higher than the data voltage of the data line DATA, so as to reversely bias the OLED 1210. The gate driving circuit 130 may turn on the second switch 1242 during the recovery period. The source driving circuit 140 may supply the data voltage (or a negative voltage) to the data line DATA during the recovery period. When the second switch 1242 is turned on, the OLED 1210 may be reversely biased by the data voltage (or the negative voltage) of the data line DATA and the reverse bias voltage (i.e., the high voltage) of the common voltage line ELVSS. After the OLED 1210 has been reversely biased for a period of time, photoelectric characteristics of the OLED 1210 may be considerably recovered.

Figure 13:
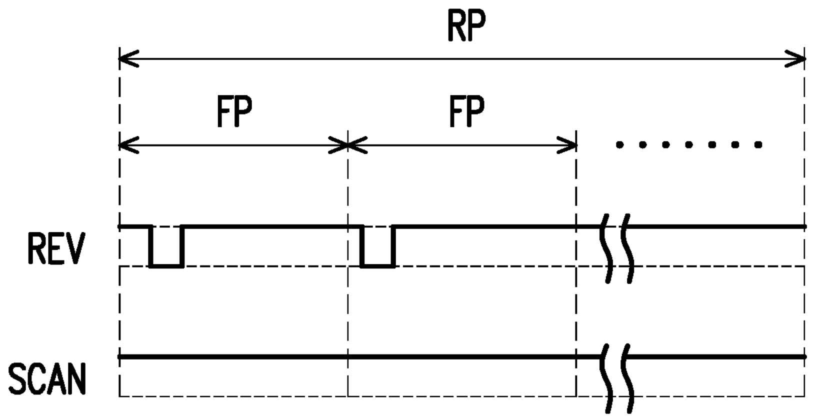
FIG. 13 is a schematic timing diagram of the control signal of the pixel circuit depicted in FIG. 12 during the recovery period according to an embodiment of the invention.

FIG. 13 is a schematic timing diagram of the control signal of the pixel circuit 1200 depicted in FIG. 12 during the recovery period RP according to an embodiment of the invention. Referring to FIG. 12 and FIG. 13, during the recovery period RP, the voltage of the scan line SCAN is maintained at a high level, i.e., the first switch 1241 is kept turned-off. In the example illustrated in FIG. 13, a length of the recovery period RP includes a plurality of frame periods FP. In each of the frame periods FP illustrated in FIG. 13, the voltage of the reverse bias control line REV has a negative pulse. In other embodiments, the voltage of the reverse bias control line REV has a plurality of negative pulses, or the voltage of the reverse bias control line REV is maintained at a low level. When the voltage of the reverse bias control line REV is a low voltage, the second switch 1242 is turned on. When the second switch 1242 is turned on, the OLED 1210 may be reversely biased by the data voltage (or the negative voltage) of the data line DATA and the reverse bias voltage (i.e., the high voltage) of the common voltage line ELVSS.

Based on the above, by the display apparatus and the operation method for the display panel thereof provided by the embodiments of the invention, the reverse bias voltage can be applied to the OLED of the pixel circuit during the recovery period. After the OLED has been reversely biased for a period of time, the photoelectric characteristics of the OLED may be considerably recovered. Thus, the display apparatus and the operation method for the display panel thereof may achieve suppressing or improving the phenomenon of decay of the OLEDs of the pixel circuits.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display apparatus, comprising:

a display panel, comprising a pixel circuit, a power supply voltage line and a common voltage line, wherein the pixel circuit comprises an organic light emitting diode (OLED), an anode of the OLED is coupled to the power supply voltage line, and a cathode of the OLED is coupled to the common voltage line; and a voltage supply circuit, coupled to the common voltage line and the power supply voltage line, wherein the voltage supply circuit supplies a common voltage to the common voltage line during a normal operation period, and the voltage supply circuit supplies a reverse bias voltage higher than the common voltage to the common voltage line and supplies a voltage lower than the reverse bias voltage to the power supply voltage line during a recovery period to reversely bias the OLED, wherein the recovery period is arranged at least one of a power-on initializing period and a power-off processing period of the display apparatus.

2. The display apparatus according to claim 1, wherein the reverse bias voltage is a power supply voltage of the display panel, and the common voltage is a ground voltage of the display panel.

3. The display apparatus according to claim 1, wherein the display panel further comprises a scan line and a data line, and the pixel circuit further comprises:

a transistor, having a first terminal, a second terminal and a control terminal, wherein the first terminal of the transistor is coupled to the power supply voltage line, and the second terminal of the transistor is coupled to the anode of the OLED;

a storage capacitor, coupled to the control terminal of the transistor; and a switch, having a first terminal, a second terminal and a control terminal, wherein the first terminal of the switch is coupled to the data line, the second terminal of the switch is coupled to the control terminal of the transistor, and the control terminal of the switch is coupled to the scan line, wherein the voltage supply circuit supplies a power supply voltage higher than the common voltage to the power supply voltage line during the normal operation period.

4. The display apparatus according to claim 3, further comprising:

a gate driving circuit, coupled to the scan line of the display panel, wherein the gate driving circuit turns on the switch during the recovery period; and a source driving circuit, coupled to the data line of the display panel, wherein the source driving circuit supplies a data voltage to the control terminal of the transistor to turn on the transistor during the recovery period.

5. The display apparatus according to claim 1, wherein the display panel further comprises an initializing voltage line, an emission control line, a first scan line, a second scan line and a data line, and the pixel circuit further comprises:

a first switch, having a first terminal, a second terminal and a control terminal, wherein the first terminal of the first switch is coupled to the power supply voltage line, and the control terminal of the first switch is coupled to the emission control line;

a transistor, having a first terminal, a second terminal and a control terminal, wherein the first terminal of the transistor is coupled to the second terminal of the first switch;

a storage capacitor, coupled to the control terminal of the transistor;

a second switch, having a first terminal, a second terminal and a control terminal, wherein the first terminal of the second switch is coupled to the data line, the control terminal of the second switch is coupled to the second scan line, and the second terminal of the second switch is coupled to the first terminal of the transistor;

a third switch, having a first terminal, a second terminal and a control terminal, wherein the first terminal of the third switch is coupled to the control terminal of the transistor, the second terminal of the third switch is coupled to the second terminal of the transistor, and the control terminal of the third switch is coupled to the second scan line;

a fourth switch, having a first terminal, a second terminal and a control terminal, wherein the first terminal of the fourth switch is coupled to the initializing voltage line, the second terminal of the fourth switch is coupled to the control terminal of the transistor, and the control terminal of the fourth switch is coupled to the first scan line;

a fifth switch, having a first terminal, a second terminal and a control terminal, wherein the first terminal of the fifth switch is coupled to the second terminal of the transistor, and the second terminal of the fifth switch is coupled to the anode of the OLED, and the control terminal of the fifth switch is coupled to the emission control line; and a sixth switch, having a first terminal, a second terminal and a control terminal, wherein the first terminal of the sixth switch is coupled to the initializing voltage line, the second terminal of the sixth switch is coupled to the anode of the OLED, and the control terminal of the sixth switch is coupled to the first scan line, wherein the voltage supply circuit supplies an initializing voltage higher than the common voltage to the initializing voltage line during the normal operation period, and the voltage supply circuit supplies the voltage lower than the reverse bias voltage to the initializing voltage line during the recovery period to reversely bias the OLED.

6. The display apparatus according to claim 5, further comprising:

a gate driving circuit, coupled to the first scan line of the display panel, wherein the gate driving circuit turns on the sixth switch during the recovery period.

7. The display apparatus according to claim 1, wherein the display panel further comprises an initializing voltage line, an emission control line, a first scan line, a second scan line and a data line, and the pixel circuit further comprises:

a first switch, having a first terminal, a second terminal and a control terminal, wherein the first terminal of the first switch is coupled to the power supply voltage line, and the control terminal of the first switch is coupled to the emission control line;

a transistor, having a first terminal, a second terminal and a control terminal, wherein the first terminal of the transistor is coupled to the second terminal of the first switch, and the second terminal of the transistor is coupled to the anode of the OLED;

a storage capacitor, having a first terminal coupled to the control terminal of the transistor and a second terminal of the storage capacitor is coupled to the second terminal of the transistor;

a second switch, having a first terminal, a second terminal and a control terminal, wherein the first terminal of the second switch is coupled to the data line, the control terminal of the second switch is coupled to the second scan line, and the second terminal of the second switch is coupled to the control terminal of the transistor;

a third switch, having a first terminal, a second terminal and a control terminal, wherein the first terminal of the third switch is coupled to the initializing voltage line, the second terminal of the third switch is coupled to the anode of the OLED, and the control terminal of the third switch is coupled to the first scan line; and a holding capacitor, having a first terminal coupled to the power supply voltage line, wherein a second terminal of the holding capacitor is coupled to the second terminal of the third switch, wherein the voltage supply circuit supplies an initializing voltage higher than the common voltage to the initializing voltage line during the normal operation period, and the voltage supply circuit supplies the voltage lower than the reverse bias voltage to the initializing voltage line during the recovery period to reversely bias the OLED.

8. The display apparatus according to claim 7, further comprising:

a gate driving circuit, coupled to the first scan line of the display panel, wherein the gate driving circuit turns on the third switch during the recovery period.

9. The display apparatus according to claim 1, wherein the display panel further comprises a reverse bias control line, a scan line and a data line, and the pixel circuit further comprises:

a transistor, having a first terminal, a second terminal and a control terminal, wherein the first terminal of the transistor is coupled to the power supply voltage line, and the second terminal of the transistor is coupled to the anode of the OLED;

a storage capacitor, coupled to the control terminal of the transistor;

a first switch, having a first terminal, a second terminal and a control terminal, wherein the first terminal of the first switch is coupled to the data line, the second terminal of the first switch is coupled to the control terminal of the transistor, and the control terminal of the first switch is coupled to the scan line; and a second switch, having a first terminal, a second terminal and a control terminal, wherein the first terminal of the second switch is coupled to the data line, the second terminal of the second switch is coupled to the anode of the OLED, and the control terminal of the second switch is coupled to the reverse bias control line, wherein the reverse bias voltage is higher than a data voltage of the data line to reversely bias the OLED.

10. The display apparatus according to claim 9, further comprising:

a gate driving circuit, coupled to the reverse bias control line of the display panel, wherein the gate driving circuit turns on the second switch during the recovery period; and a source driving circuit, coupled to the data line of the display panel, wherein the source driving circuit supplies the data voltage or a negative voltage to the data line during the recovery period.

11. An operation method for a display panel comprising a pixel circuit, a power supply voltage line and a common voltage line, the pixel circuit comprising an organic light emitting diode (OLED), an anode of the OLED is coupled to the power supply voltage line, and a cathode of the OLED being coupled to the common voltage line, and the operation method comprising:

supplying a common voltage to the common voltage line during a normal operation period; and supplying a reverse bias voltage higher than the common voltage to the common voltage line and supplying a voltage lower than the reverse bias voltage to the power supply voltage line during a recovery period to reversely bias the OLED, wherein the recovery period is arranged at least one of a power-on initializing period and a power-off processing period of the display apparatus.

12. The operation method according to claim 11, wherein the reverse bias voltage is a power supply voltage of the display panel, and the common voltage is a ground voltage of the display panel.

13. The operation method according to claim 11, wherein the display panel further comprises an initializing voltage line, the pixel circuit further comprises a switch, a first terminal of the switch is coupled to the initializing voltage line, a second terminal of the switch is coupled to the anode of the OLED, and the operation method further comprises:

turning on the switch during the recovery period; and supplying the voltage lower than the reverse bias voltage to the initializing voltage line during the recovery period to reversely bias the OLED.

14. The operation method according to claim 11, wherein the display panel further comprises a data line, the pixel circuit further comprises a switch, a first terminal of the switch is coupled to the data line, a second terminal of the switch is coupled to the anode of the OLED, and the operation method further comprises:

turning on the switch during the recovery period; and supplying a data voltage or a negative voltage to the data line during the recovery period to reversely bias the OLED, wherein the data voltage and the negative voltage are lower than the reverse bias voltage.

* * * * *